United States Patent
Lin et al.

(10) Patent No.: US 10,063,236 B2
(45) Date of Patent: Aug. 28, 2018

(54) LOW-VOLTAGE DIFFERENTIAL SIGNALING TRANSMITTER AND RECEIVER

(71) Applicant: YUAN ZE UNIVERSITY, Taoyuan (TW)

(72) Inventors: Hung-Wen Lin, Taoyuan (TW); Shih-Fang Jhou, Taoyuan (TW); Chih-Hsiang Shao, Taoyuan (TW)

(73) Assignee: YUAN ZE UNIVERSITY, Taoyuan (TW)

( * ) Notice: Subject to any disclaimer, the term of this patent is extended or adjusted under 35 U.S.C. 154(b) by 0 days.

(21) Appl. No.: 15/377,115

(22) Filed: Dec. 13, 2016

(65) Prior Publication Data

US 2018/0054199 A1    Feb. 22, 2018

(30) Foreign Application Priority Data

Aug. 17, 2016 (TW) ............... 105126291 A

(51) Int. Cl.
*H03K 3/00* (2006.01)
*H03K 19/0185* (2006.01)
*H03K 17/687* (2006.01)

(52) U.S. Cl.
CPC . *H03K 19/018528* (2013.01); *H03K 17/6872* (2013.01)

(58) Field of Classification Search
CPC ............................................. H03K 19/018528
See application file for complete search history.

(56) References Cited

U.S. PATENT DOCUMENTS 8,446,173 B1 * 5/2013 Faucher ........... H03K 19/00361
326/27

OTHER PUBLICATIONS

Shi-Fung Zhou and Hung-Wand Hung-Wenen, 2016 VLSI Design / CAD Symposium,Aug. 2, 2016,p. p1-6, Yuan Ze Universtity,Taoyuan City, Taiwan.

* cited by examiner

*Primary Examiner* — Daniel Puentes
(74) *Attorney, Agent, or Firm* — Muncy, Geissler, Olds & Lowe, P.C.

(57) ABSTRACT

A low-voltage differential signaling transmitter includes a stage-by-stage amplification module, a level adjustment module, and a drive module. The level adjustment module shifts upward and shift downward a differential mode received signal, so as to, after enabling upward-shifted and downward-shifted signals to overcome a threshold voltage of a load transistor inside a post-stage circuit, have more headroom to improve an operation bandwidth of the load resistor. A low-voltage differential signaling receiver is also proposed herein.

8 Claims, 11 Drawing Sheets

LOW-VOLTAGE DIFFERENTIAL SIGNALING TRANSMITTER AND RECEIVER

CROSS-REFERENCE TO RELATED APPLICATION

This non-provisional application claims priority under 35 U.S.C. § 119(a) to Patent Application No. 105126291 filed in Taiwan, R.O.C. on Aug. 17, 2016, the entire contents of which are hereby incorporated by reference.

BACKGROUND

Technical Field

The present invention relates to a communications circuit, and in particular, to a low-voltage differential signaling transmitter and a low-voltage differential signaling receiver.

Related Art

Low-voltage differential signaling transmitter and receiver are usually used in an high speed data transmission application such as computer buses system. However, in a low-voltage environment, how to improve a bandwidth and efficiently use a power resource is a major problem.

SUMMARY

The present invention provides a low-voltage differential signaling transmitter, including a stage-by-stage amplification module, a level adjustment module, and a drive module. The stage-by-stage amplification module includes a plurality of amplifiers connected in sequence to receive and amplify a pair of differential input signals, so as to output a first input signal and a second input signal. The level adjustment module includes two shift units, where after being connected to the stage-by-stage amplification module, each of the shift units includes: a first capacitor; a second capacitor; a first transistor, including a first end, a second end, and a first control end, where the first end is connected to the first capacitor, so as to receive the first input signal by using the first capacitor; and a second transistor, including a third end, a fourth end, and a second control end, where the fourth end is connected to the second capacitor, so as to receive the second input signal by using the second capacitor. The first control end of the first transistor is connected to the fourth end of the second transistor, the second control end of the second transistor is connected to the first end of the first transistor, the second end of the first transistor is connected to the third end of the second transistor, so as to form a node therebetween, the node of one of the two shift units receives a first bias voltage to shift the first and second input signals downward, so as to output the first and second input signals respectively by using the first end and the fourth end, the node of the other of the two shift units receives a second bias voltage to shift the first and second input signals upward, so as to output first and second input signals respectively by using the first end and the fourth end. The drive module is connected to the two shift units of the level adjustment module, so as to output a pair of differential output signals according to the first and second input signals that are shifted and that are output by the two shift units.

The present invention additionally provides a low-voltage differential signaling receiver, configured to receive a differential input signal constituted by a first input signal and a second input signal. The low-voltage differential signaling receiver includes two shift units, where each of the shift units includes: a first capacitor; a second capacitor; a first transistor, including a first end, a second end, and a first control end, where the first control end is connected to the first capacitor and receives a first bias voltage; and a second transistor, including a third end, a fourth end, and a second control end, where the second control end is connected to the second capacitor and receives a second bias voltage. The first end of the first transistor receives a working voltage, the fourth end of the second transistor is grounded, and the second end of the first transistor is connected to the third end of the second transistor, so as to form a node therebetween. In one of the two shift units, the first control end and the second control end further receive the first input signal respectively by using the first capacitor and the second capacitor and output a first output signal on the node. In the other of the two shift units, the first control end and the second control end receive the second input signal respectively by using the first capacitor and the second capacitor, and output a second output signal on the node.

In conclusion, by applying embodiments of the present invention, low-voltage differential signaling transmitter and receiver are applicable to a low supply voltage environment (for example, the supply voltage is approximately equal to a threshold voltage of a transistor), and meanwhile, because there is no current source, the area of the circuits may be saved.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
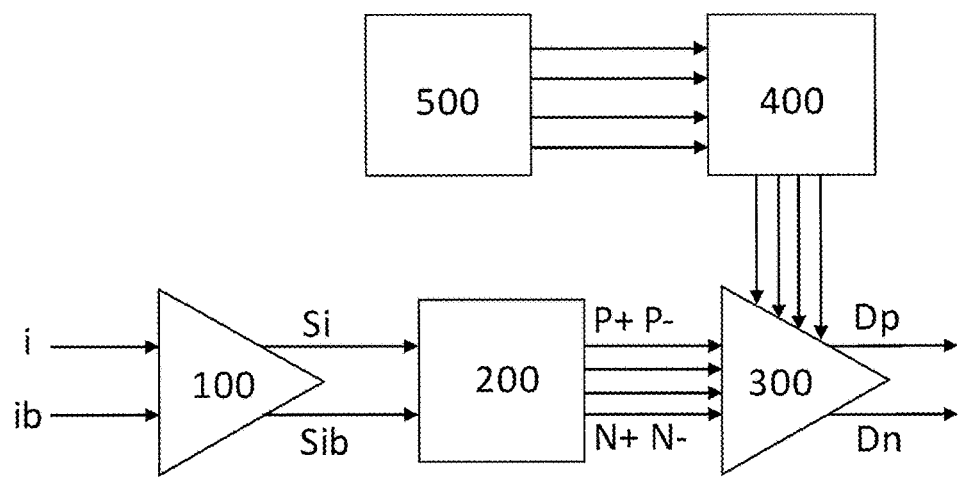
FIG. 1 is a schematic block diagram of a low-voltage differential signaling transmitter according to an embodiment of the present invention.

A plurality of implementation manners of the present invention is disclosed below by using drawings, and to clear the description, many details in practices are described in the following. However, it should be understood that the details in practices should not be used to limit the present limitation. That is, in some implementation manners of the present invention, the details in practices are not necessary. In addition, to simplify the drawings, some known structures and are components are shown in a simple presentation manner in the drawings.

Refer to FIG. 1, which is a schematic block diagram of a low-voltage differential signaling (LVDS) transmitter according to an embodiment of the present invention. The low-voltage differential signaling transmitter includes a stage-by-stage amplification module 100, a level adjustment module 200, a drive module 300, a signal adaptation module 400, and a voltage generation module 500.

In an embodiment, the low-voltage differential signaling transmitter may merely include a stage-by-stage amplification module 100, a level adjustment module 200, and a drive module 300, and does not include a signal adaptation module 400 and a voltage generation module 500. Internal compositions and functions of respective modules are described in detail below.

Figure 2:
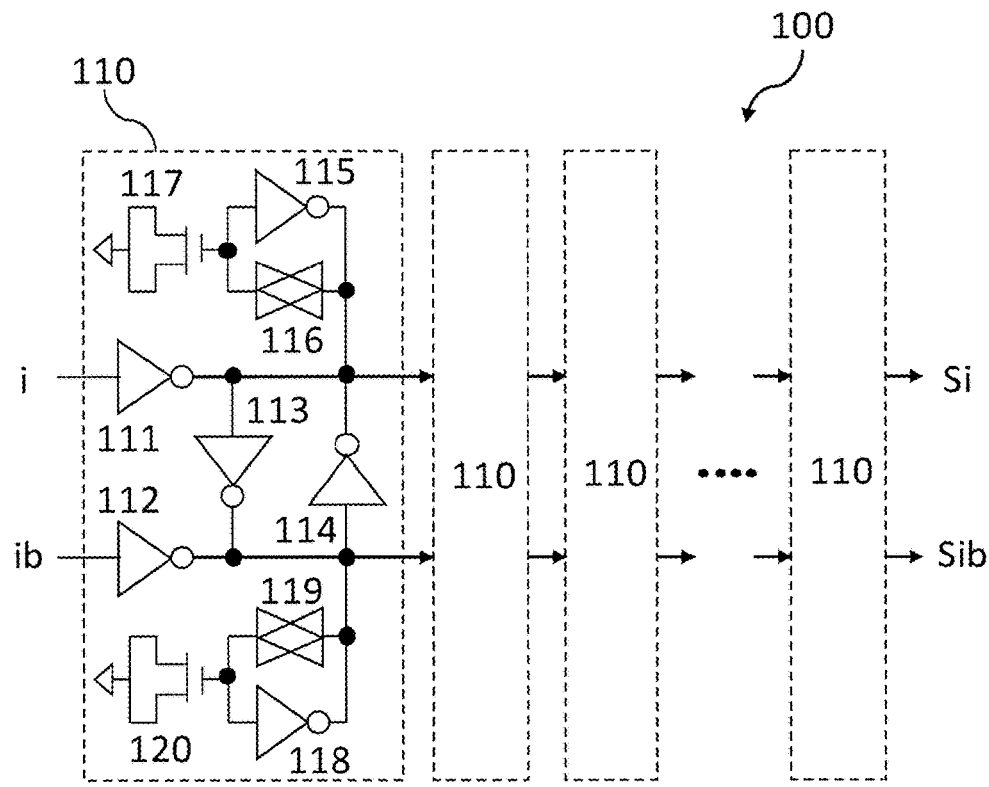
FIG. 2 is a schematic block diagram of a circuit of a stage-by-stage amplification module according to an embodiment of the present invention.

Refer to FIG. 2, which is a schematic block diagram of a circuit of a stage-by-stage amplification module 100 according to an embodiment of the present invention. The stage-by-stage amplification module 100 includes a plurality of amplifiers 110 and is formed by connecting the amplifiers 110 in series in sequence. Different numbers of amplifiers 110 may be disposed according to a needed signal amplification factor. If the needed amplification factor is greater, more amplifiers 110 may be disposed; and otherwise, if the needed amplification factor is smaller, fewer amplifier 110 may be disposed. The amplifiers 110 have the same internal composition but different sizes, and are proportionally amplified stage by stage, that is, the area of a second-stage amplifier 110 is two times the area of a first-stage amplifier 110, the area of a third-stage amplifier 110 is two times the area of the second-stage amplifier 110, and so one. In some embodiments, the respective amplifier 110 may have different internal compositions.

The internal composition of each amplifier 110 is shown as an amplifier 110 on the leftmost in FIG. 2. The amplifier 110 includes a plurality of inverters and a plurality of transmission gates. An inverter 111 and an inverter 112 server as a differential pair to respectively receive a pair of differential input signals i, ib and further amplify and output the differential input signals i, ib. The inverter 113 and inverter 114 are connected between output ends of inverters 111, 112. In addition, an input end of the inverter 113 is connected to an output end of the inverter 114, and an input end of the inverter 114 is connected to an output end of the inverter 113, so as to form a feedback circuit, thereby providing a favorable common mode rejection ratio and reduce input common mode noise. The output end of the inverter 111 is also connected to an inverter 115 and a transmission gate 116. An end of the transmission gate 116 and an output end of the inverter 115 are connected together to the output end of the inverter 111, and another end of the transmission gate 116 and an input end of the inverter 115 are connected to each other and are connected to a control end of a transistor 117 (where a metal-oxide-semiconductor field-effect transistor is used as an example, that is, a gate). Two other ends (which are a source and a drain herein) of the transistor 117 are grounded, so as to use the transistor 117 as a capacitor, thereby forming a capacitive load. The inverter 115 and the transmission gate 116 serve as an inductive load, so as to form a bandwidth control circuit, so that a common mode level can be established and a circuit bandwidth can be changed. A magnitude of the capacitive load may change an effective inductance value of the inductive load and a band range in which the inductive load has an inductive feature. The inductive load and an input capacitor of a load circuit connected to the output end generate a minor resonance, so as to improve a bandwidth of the stage-by-stage amplification module 100 and reduce a transition time of an output end signal, thereby improving a data transmission rate. Similarly, the output end of the inverter 112 is also connected to an inverter 118 and a transmission gate 119, and the inverter 118 and the transmission gate 119 are also connected to another transistor 120. Therefore, by connecting multiple stages of amplifiers 110 in series, the differential input signals i, ib may be amplified stage by stage to output a first input signal and a second input signal Si, Sib.

Figure 3:
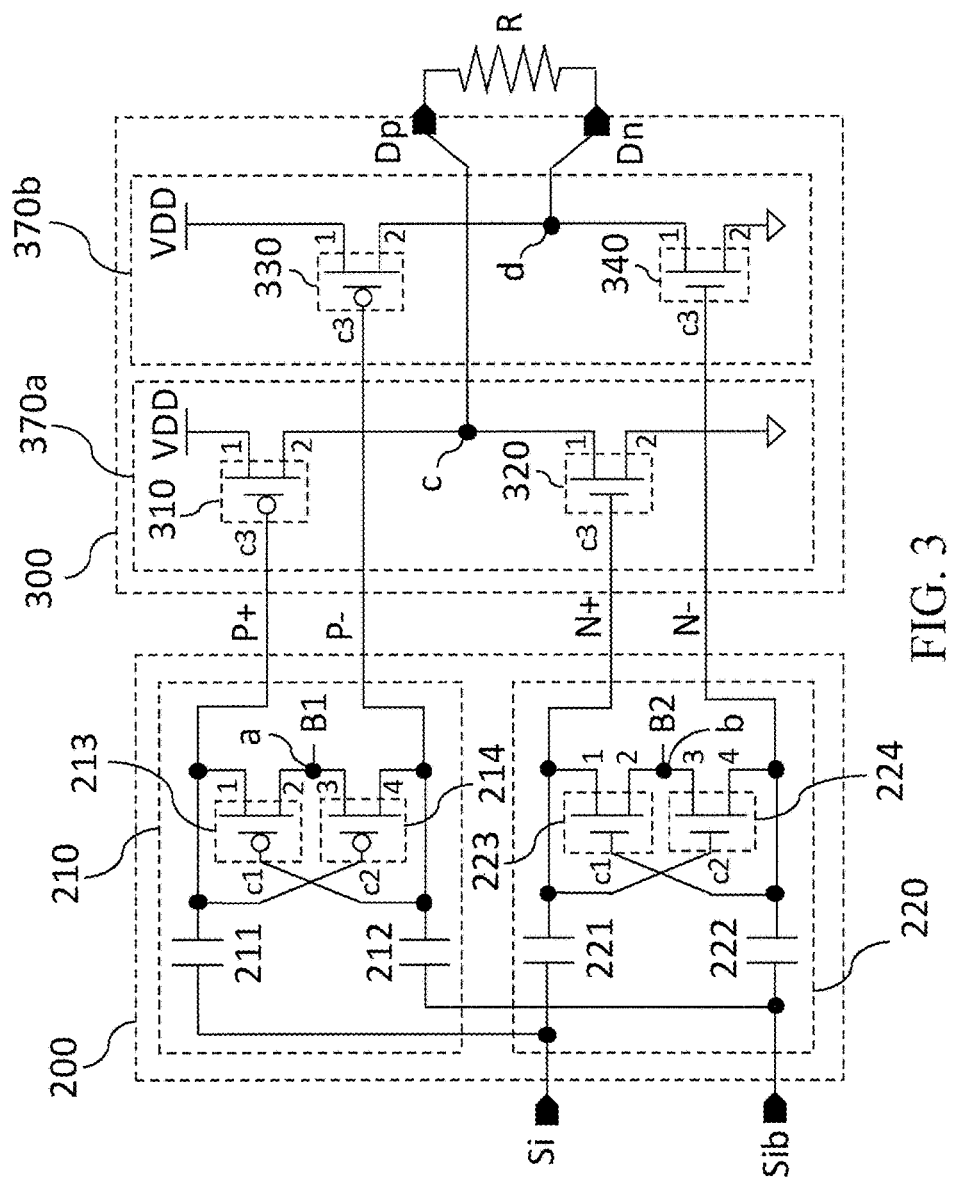
FIG. 3 is a schematic block diagram of circuits of a level adjustment module and a drive module according to an embodiment of the present invention.

Refer to FIG. 3, which is a schematic block diagram of circuits of a level adjustment module 200 and a drive module 300 according to an embodiment of the present invention. The level adjustment module 200 includes two shift units 210, 220, so as to, after being connected to the foregoing stage-by-stage amplification module 100, receive a first input signal and a second input signal Si, Sib that have been amplified. The shift unit 210 includes a first capacitor 211, a second capacitor 212, a first transistor 213, and a second transistor 214. In this embodiment, the first transistor 213 and the second transistor 214 are P-type metal oxide semiconductor transistors (PMOSs). The first transistor 213 includes a first end 1, a second end 2 (namely a source and a drain), and a first control end c1 (namely, a gate). The second transistor 214 includes a third end 3, a fourth end 4 (namely, a source and a drain), and a second control end c2 (namely, a gate). The first end 1 of the first transistor 213 is connected to the first capacitor 211, so as to receive the first input signal Si by using the first capacitor 211. The fourth end 4 of the second transistor 214 is connected to the second capacitor 212, so as to receive the second input signal Sib by using the second capacitor 212. The first control end c1 of the first transistor 213 is connected to the fourth end 4 of the second transistor 214, and the second control end c2 of the second transistor 214 is connected to first end 1 of the first transistor 213. The second end 2 of the first transistor 213 is connected to the third end 3 of the second transistor 214, so as to form a node a therebetween, for receiving a first bias voltage B1, so as to shift the first input signal Si and the second input signal Sib downward, thereby respectively forming downward-shifted signals P+, P− and outputting them by using the first end 1 of the first transistor 213 and the fourth end 4 of the second transistor 214. The first bias voltage B1 ranges from 0 volt to a supply voltage VDD. The supply voltage VDD needs to be at least greater than a half of a transistor threshold voltage, for example, if the transistor threshold voltage is 0.5 volts, the supply voltage VDD needs to be greater than 0.25 volts.

Figure 4:
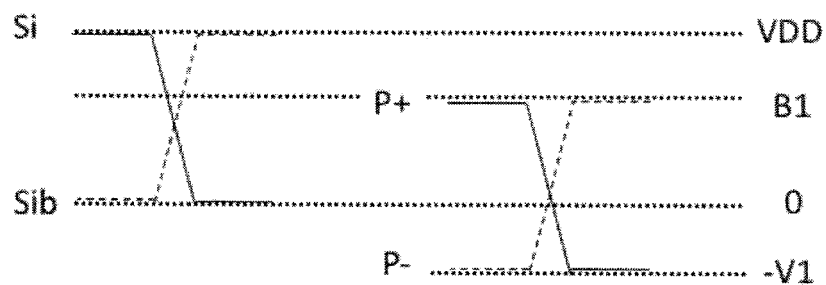
FIG. 4 is a schematic diagram of a signal change of a shift unit.

FIG. 4 is a schematic diagram of a signal change of a shift unit 210. As shown in FIG. 4, when the first input signal Si changes from the supply voltage VDD to 0 volt (a solid line on the left side), and the second input signal Sib changes from 0 volt to the supply voltage VDD (a dashed line on the left side), a voltage value of the first control end c1 of the first transistor 213 is changed from (B1−VDD) volts to B1 volts, and a voltage value of the first end 1 is changed from B1 volts to (B1−VDD) volts. Therefore, the first transistor 213 is switched off. Conversely, a voltage value of the second control end c2 of the second transistor 214 is changed from B1 volts to (B1−VDD) volts, and a voltage value of the fourth end 4 is changed from (B1−VDD) volts to B1 volts. Therefore, the second transistor 214 is switched on, so that the downward-shifted signal P− is shifted downward from a typical high logic level (the supply voltage VDD) of the second input signal Sib to the first bias voltage B1 (a dashed line on the right side). According to another aspect, because the first input signal Si and second input signal Sib are differential signals, the downward-shifted signal P+ is also shifted downward to the voltage—V1 (a solid line on the right side), that is, being equal to (B1−VDD) volts. In another case, when the first input signal Si changes from 0 volt to the supply voltage VDD (a solid line on the left side), and the second input signal Sib changes from the supply voltage VDD to 0 volt (a dashed line on the left side), a voltage value of the first control end c1 of the first transistor 213 is changed from B1 volts to (B1−VDD) volts, and a voltage value of the first end 1 is changed from (B1−VDD) volts to B1 volts. Therefore, the first transistor 213 is switched on, so as to shift downward the downward-shifted signal P+ from the typical high logic level (the supply voltage VDD) of the original first input signal Si to B1 volts (a dashed line on the right side). Conversely, a voltage value of the second control end c2 of the second transistor 214 is changed from (B1−VDD) volts to B1 volts, and a voltage value of the fourth end 4 is changed from B1 volts to (B1−VDD) volts. Therefore, the second transistor 214 is switched off. Because the first input signal Si and second input signal Sib are differential signals, the downward-shifted signal P− is also shifted downward (a solid line on the right side).

Similarly, the shift unit 220 includes a first capacitor 221, a second capacitor 222, a first transistor 223, and a second transistor 224, and their connection relationships are the same as those in the foregoing shift unit 210, and are not described in detail again herein. The shift unit 220 differs from the shift unit 210 in that the first transistor 223 and second transistor 224 of the shift unit 220 are N-type metal oxide semiconductor transistors (NMOSs). In the shift unit 220, a second end 2 of the first transistor 223 is connected to a third end 3 of the second transistor 224, so as to form a node b therebetween, which receives a second bias voltage B2, so as to shift the first input signal Si and the second input signal Sib upward by the second bias voltage B2, thereby respectively forming upward-shifted signals N+, N− and outputting them by using the first end 1 of the first transistor 223 and the fourth end 4 of the second transistor 224. The second bias voltage B2 ranges from 0 volt to a supply voltage VDD.

Figure 5:
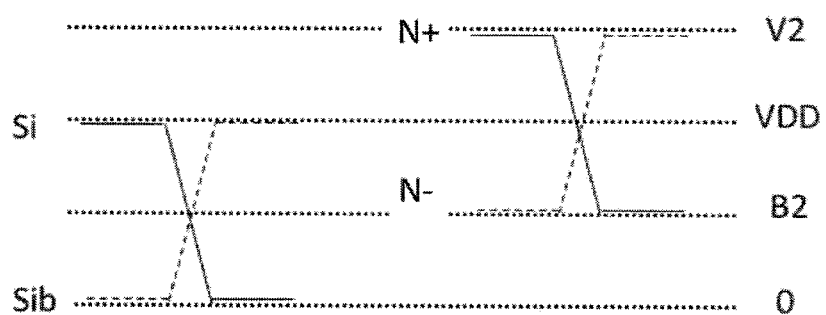
FIG. 5 is a schematic diagram of a signal change of the other shift unit.

FIG. 5 is a schematic diagram of a signal change of a shift unit 220. As shown in FIG. 5, when the first input signal Si changes from the supply voltage VDD to 0 volt (a solid line on the left side), and the second input signal Sib changes from 0 volt to the supply voltage VDD (a dashed line on the left side), a voltage value of the first control end c1 of the first transistor 223 is changed from B2 volts to (B2+VDD) volts, and a voltage value of the first end 1 is changed from (B2+VDD) volts to B2 volts. Therefore, the first transistor 223 is switched on, so as to shift upward the upward-shifted signal N+ from a typical low logic level (0 volt) of the original first input signal Si to B2 volts (a solid line on the right side). Conversely, a voltage value of the second control end c2 of the second transistor 224 is changed from (B2+VDD) volts to B2 volts, and a voltage value of the fourth end 4 is changed from B2 volts to (B2+VDD) volts. Therefore, the second transistor 224 is switched off. Because the first input signal Si and second input signal Sib are differential signals, the upward-shifted signal N+ is also shifted upward to the voltage V2 (a dashed line on the right side), that is, being equal to (B2+VDD) volts. In another case, when the first input signal Si changes from 0 volt to the supply voltage VDD (a dashed line on the left side), and the second input signal Sib changes from the supply voltage VDD to 0 volt (a solid line on the left side), a voltage value of the first control end c1 of the first transistor 213 is changed from (B2+VDD) volts to B2 volts, and a voltage value of the first end 1 is changed from B2 volts to (B2+VDD) volts. Therefore, the first transistor 213 is switched off. Conversely, a voltage value of the second control end c2 of the second transistor 214 is changed from B2 volts to (B2+VDD) volts, and a voltage value of the fourth end 4 is changed from (B2+VDD) volts to B2 volts. Therefore, the second transistor 214 is switched on, so that the upward-shifted signal N− is shifted upward from the typical low logic level (0 volt) of the second input signal Sib to the first bias voltage B1 (a solid line on the right side). Because the first input signal Si and second input signal Sib are differential signals, the upward-shifted signal N− is also shifted upward (a dashed line on the right side).

Refer to FIG. 3 again, in which 300 includes four third transistors 310, 320, 330, 340, where the third transistors 310, 330 are PMOSs, and the third transistors 320, 340 are NMOSs. A third control end c3 (namely, a gate) of the third transistor 310 is connected to the first end 1 of the first transistor 213 of the shift unit 210 to receive the downward-shifted signal P+. The third control end c3 of the third transistor 330 is connected to the fourth end 4 of the second transistor 214 of the shift unit 210 to receive the downward-shifted signal P−. The third control end c3 of the third transistor 320 is connected to the fourth end 1 of the first transistor 223 of the shift unit 220 to receive the upward-shifted signal N+. The third control end c3 of the third transistor 340 is connected to the fourth end 4 of the second transistor 224 of the shift unit 220 to receive the upward-shifted signal N−. First ends 1 of the third transistors 310, 330 are connected to the voltage VDD. Second ends 2 of the third transistors 320, 340 are grounded. The second end 2 of the third transistor 310 is connected to the first end 1 of third transistor 320 (that is, the third transistor 310 and the third transistor 320 are connected in series to each other), and a node c therebetween is connected to a first output end Dp; the second end 2 of the third transistor 330 is connected to the first end 1 of the third transistor 340 (that is, the third transistor 330 and the third transistor 340 are connected in series to each other), and a node d therebetween to a second output end Dn. The first output end Dp and the second output end Dn are connected to a signal receiving end (represented by a resistor R herein).

Referring to FIG. 4 and FIG. 5 together and the foregoing description, when the first input signal Si is 0 volt, and the second input signal Sib is the voltage VDD, the downward-shifted signal P+ is voltage −V1 (namely, B1−VDD), and the downward-shifted signal P− is the first bias voltage B1, and meanwhile, the upward-shifted signal N+ is the second bias voltage B2, and the upward-shifted signal N− is the voltage V2 (namely, B2+VDD). In this way, referring to FIG. 3, the third transistors 320, 330 are switched on, the third transistors 310, 340 are switched off, and a current supplied by the voltage VDD flows through the third transistor 330 and the node c in sequence, then flows out through the first output end Dp, passes through the signal receiving end to return on the second output end Dn, and further flows through the node d and the third transistor 320 to flow to the ground. In another case, when the first input signal Si is the voltage VDD, and the second input signal Sib is 0 volt, the downward-shifted signal P+ is the first bias voltage B1, and the downward-shifted signal P− is the voltage −V1, and meanwhile, the upward-shifted signal N+ is the voltage V2, and the upward-shifted signal N− is the second bias voltage B2. In this way, referring to FIG. 3, the third transistors 330, 340 are switched on, the third transistors 320, 330 are switched off, and a current supplied by the voltage VDD flows through the third transistor 310 and the node d in sequence, then flows out through the second output end Dn, passes through the signal receiving end to return on the first output end Dp, and further flows through the node c and the third transistor 330 to flow to the ground. In this way, differential output signals may be output by using the output ends Dp, Dn according to the differential input signals Si, Sib. Because in the level adjustment module 200, the differential input signals Si, Sib are respectively shifted upward and downward to offset threshold voltages of the third transistors 310, 320, 330, 340, when the third transistors 310, 320, 330, 340 are switched on, voltage amplitudes received by the third control end c3 are all used to drive a signal, so as to increase amplitudes of the differential output signals Dp, Dn and the bandwidths of the third transistors 310, 320, 330, 340. To reduce the area of the circuit, the drive module 300 of the embodiments of the present invention does not have a conventional current source, but has first inverters 370a, 370b, similar to a differential operation, respectively formed from the foregoing third transistors 310, 320, 330, 340.

Figure 6:
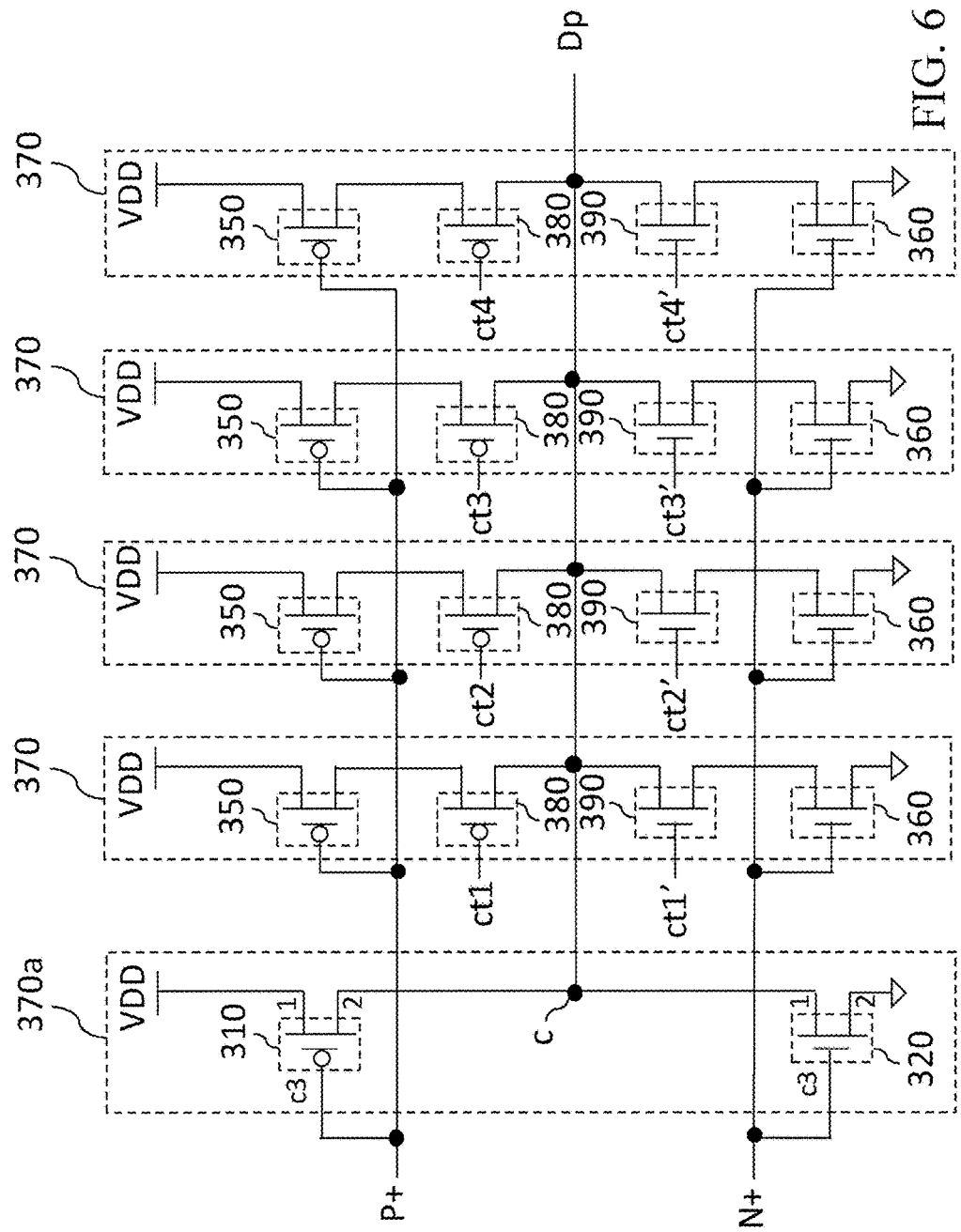
FIG. 6 is another schematic diagram of a part of a drive module according to another embodiment of the present invention.
Figure 7:
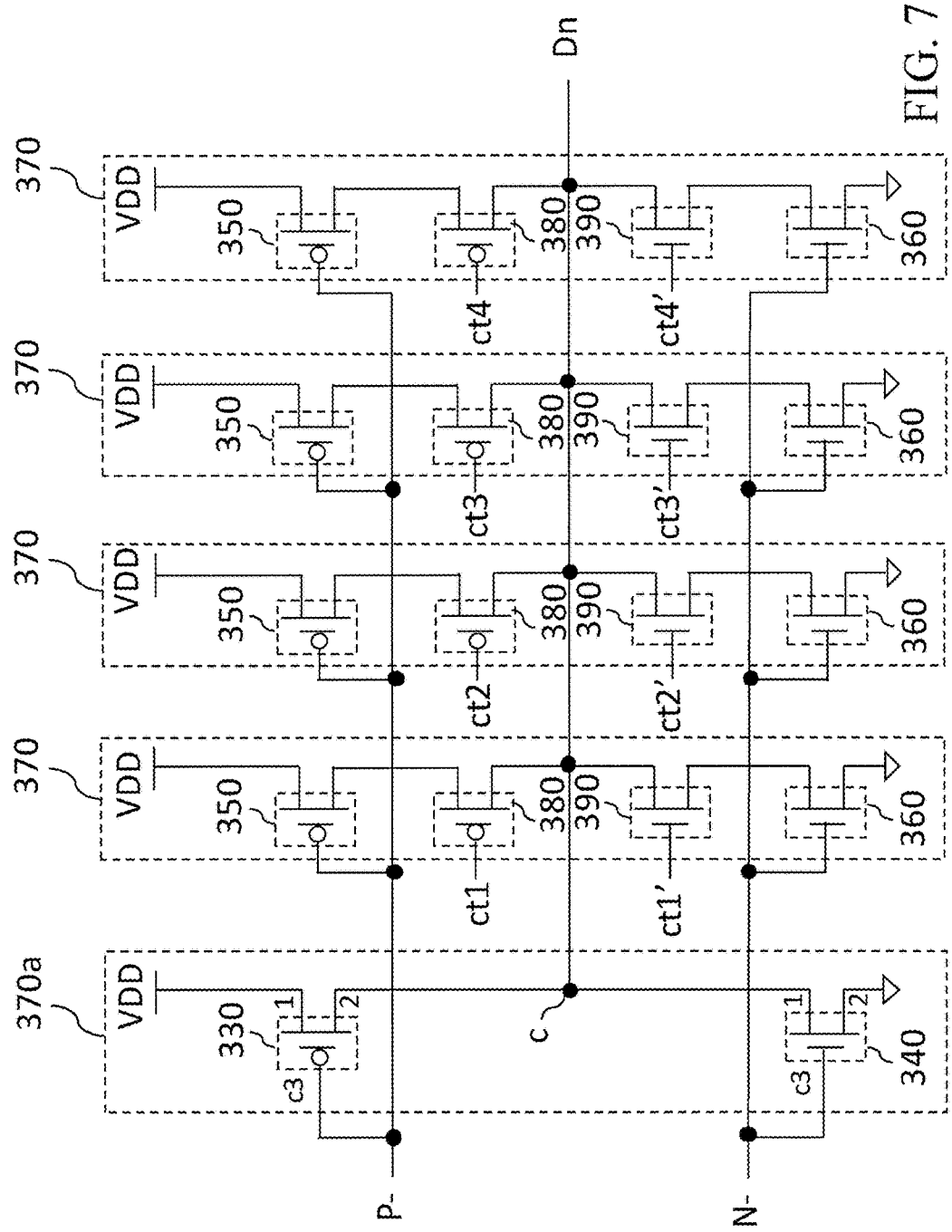
FIG. 7 is another schematic diagram of another part of a drive module according to another embodiment of the present invention.

Refer to FIG. 6, which is another schematic diagram of a part of a drive module 300 according to another embodiment of the present invention. To the drawing clear, the drive module 300 is not completely drawn, and merely the circuit from the place for receiving the downward-shifted signal P+ and the upward-shifted signal N+ to the first output end Dp is shown. As shown in FIG. 6, the difference from the drive module 300 shown in FIG. 3 is that in this embodiment, a plurality of second inverters formed by connecting two fourth transistors 350, 360 in series is also connected following the third transistors 310, 320 (the first inverter 370a), and two fifth transistors 380, 390 are also connected between the two fourth transistors 350, 360. The fourth transistor 350 and fifth transistor 380 are PMOSs; and the fourth transistor 360 and fifth transistor 390 are NMOSs. The fifth transistor 380, 390 are used as switches to respectively control whether to connect the two fourth transistors 350, 360 to the node c (or the first output end Dp). If they are connected to the node c, the second inverter 370 may be used, and otherwise, if they are disconnected from the node c, the second inverter 370 is not used. Control ends of the fifth transistors 380, 390 of the second inverter 370 of each stage respectively receive control signals ct1, ct1', ct2, ct2', ct3, ct3', ct4, ct4' to deteiniine whether the fifth transistors 380, 390 are switched on or off, so as to determine whether the second inverter 370 of each stage functions. Because the fifth transistors 380, 390 are respectively a PMOS and an NMOS, logics of control signals of each group are opposite. That is, the control signal ct1 and the control signal ct1' are logics opposite to each other, similarly, control signals ct2, ct3, ct4 and control signals ct1', ct3', ct4' are also logics opposite to each other respectively, so as to enable the fifth transistors 380, 390 to be switched on or off simultaneously. Similarly to the first inverter 370a, a control end of the fourth transistor 350 of the second inverter 370 receives the downward-shifted signal P+; a control end of the fourth transistor 360 of the second inverter 370 receives the upward-shifted signal N+; when the fifth transistors 380, 390 of the same second inverter 370 are switched on, an action of the second inverter 370, the same as the related description on the first inverter 370a in FIG. 3, may further enhance the signal amplitude and bandwidth; and conversely, if it is unnecessary to enhance the signal amplitude and width, the fifth transistors 380, 390 may be switched off. In other words, when more second inverters 370 function, the signal amplitude and width are further enhanced. Herein, although FIG. 6 shows that four stages of second inverters 370 are connected in series following the first inverter 370a, the number of the second inverters 370 is not limited thereto and may also be increased or reduced. According to the foregoing description, a person of ordinary skill in the art shall understand an operation principle of another same circuit connected between the place for receiving the downward-shifted signal P− and the upward-shifted signal N− and the second output end Dn (as shown in FIG. 7), which is not further described herein.

Figure 8:
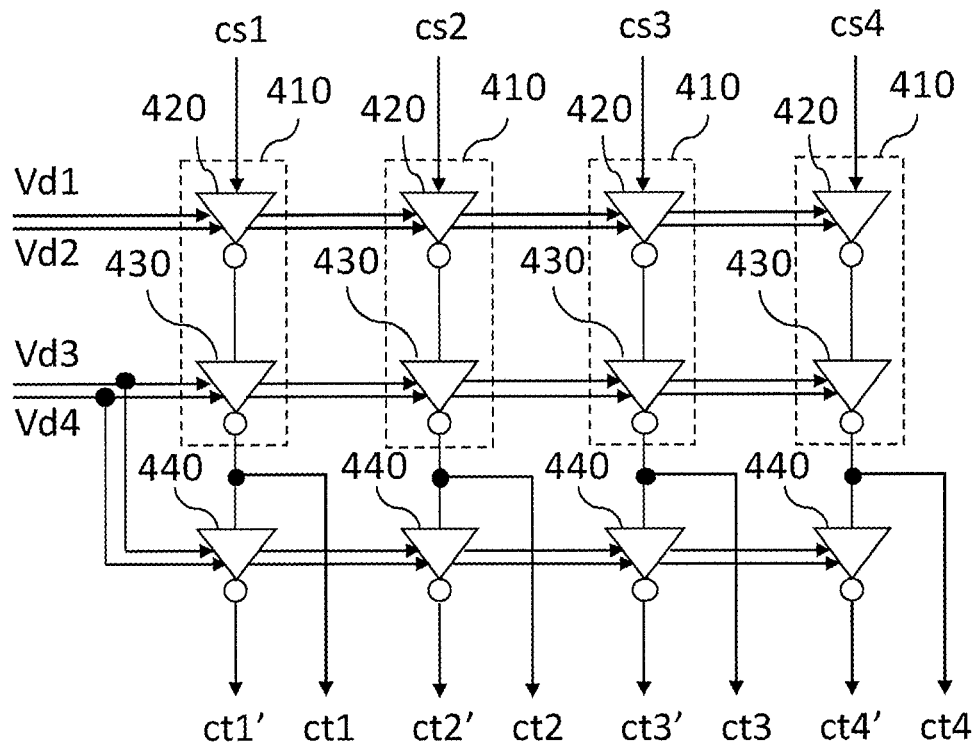
FIG. 8 is a schematic diagram of a signal adaptation module according to an embodiment of the present invention.
Figure 9:
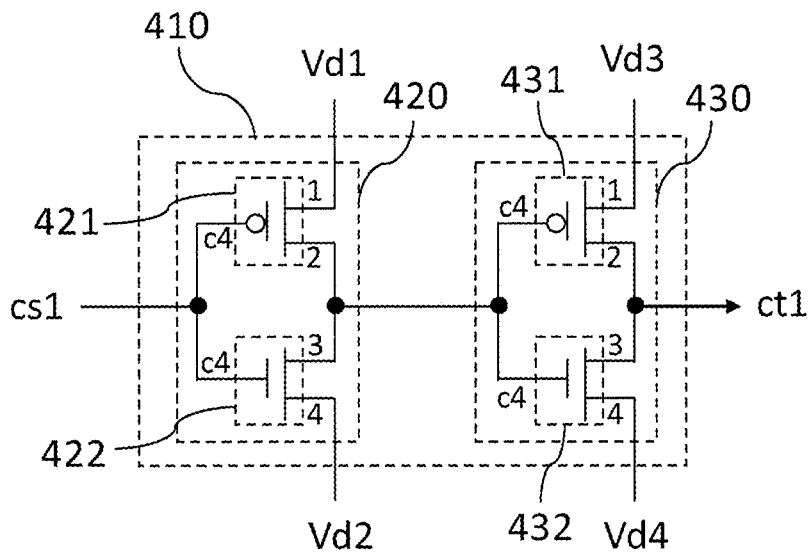
FIG. 9 is a schematic diagram of a signal conversion unit according to an embodiment of the present invention.

Refer to FIG. 8, which is a schematic diagram of a signal adaptation module 400 according to an embodiment of the present invention. The signal adaptation module 400 includes multiple signal conversion units 410 (four signal conversion units are used as an example to cooperate with the number of the foregoing second inverters 370) to respectively receive manipulation signals cs1 to cs4, so as to convert the manipulation signals cs1 to cs4 to the foregoing control signals ct1 to ct4, and respectively convert the control signals ct1 to ct4 to the control signals ct1' to ct4' respectively by using the fourth inverter 440. The signal conversion unit 410 includes a plurality of third inverters 420, 430 connected in series (two third inverters are used as an example herein). As shown in FIG. 9, which is a schematic diagram of a signal conversion unit 410 according to an embodiment of the present invention, a signal conversion unit 410 of the first stage is used as an example. The third inverter 420 is formed by connecting two sixth transistors 421, 422 in series. A second end 2 of the sixth transistor 421 is connected to a third end 3 of the sixth transistor 422 to serve as output of the third inverter 420. The sixth transistor 421 is a PMOS, and the sixth transistor 422 is an NMOS. A fourth control end c4 of the sixth transistor 421 is connected to a fourth control end c4 of the sixth transistor 422 to receive a manipulation signal cs1. A first end 1 of the sixth transistor 421 receives a first logic voltage Vd1, and a fourth end 4 of the sixth transistor 422 receives a second logic voltage Vd2. Similarly, the third inverter 430 also has two sixth transistors 431, 432 connected in series. Fourth control ends c4 of the sixth transistors 431, 432 are connected to an output end of the third inverter 420. A first end 1 of the sixth transistor 431 receives another first logic voltage Vd3, and a fourth end 4 of the sixth transistor 432 receives another second logic voltage Vd4. A second end 2 of the sixth transistor 431 is connected to a third end 3 of the sixth transistor 432 to serve as output of the third inverter 430, so as to output a control signal ct1. The first logic voltage is a voltage whose logic is "1", and the second logic voltage is a voltage whose logic is "0".

In an embodiment, a voltage value of the first logic voltage Vd1 is (VDD+Vtp), Vtp is the threshold voltage of the sixth transistors 421, 431, a voltage value of the second logic voltage Vd2 is −Vtn, and Vtn is the threshold voltage of the sixth transistors 422, 432. The manipulation signal cs1 is 0 volt or the supply voltage VDD. Therefore, when the manipulation signal is 0 volt, the sixth transistor 421 is switched on and the sixth transistor 422 is just switched to be switched off, so that the output of the third inverter 420 is equivalent to the first logic voltage Vd1 (namely, VDD+Vtp). In this embodiment, a voltage value of the first logic voltage Vd3 is (VDD+2Vtp), and a voltage value of the second logic voltage Vd4 is −2Vtn. Therefore, when the output of the third inverter 420 is equivalent to the first logic voltage Vd1 (namely, VDD+Vtp), the sixth transistor 431 is just switched to be switched off and the sixth transistor 432 is switched on, so that the output (namely, the control signal ct1) of the third inverter 430 is equivalent to the second logic voltage Vd4 (namely, −2Vtn). In another case, when the manipulation signal cs1 is VDD, the sixth transistor 421 is just switched to be switched off and the sixth transistor 422 is switched on, so that the output of the third inverter 420 is equivalent to the second logic voltage Vd2 (namely, −Vtn). Therefore, when the output of third inverter 420 is equal to the second logic voltage Vd2, the sixth transistor 431 is switched on and the sixth transistor 432 is just switched to be switched off, so that the output of the third inverter 430 is equivalent to the first logic voltage Vd3 (namely, VDD+2Vtp). In other words, the original manipulation signal cs1 is 0 volt or the voltage VDD, and after passing through the signal conversion unit 410, is converted to the second logic voltage Vd4 (−2Vtn) or the first logic voltage Vd3 (VDD+2Vtp), that is, the amplitude of the signal is increased.

In an embodiment, numerals of the voltages Vd1 to Vd4 may be changed in a resistance voltage division manner, and the voltage values thereof are not limited to the foregoing ones.

Referring to FIG. 8 again, the output end of the signal conversion unit 410 is also connected to a fourth inverter 440 to output control signals ct1' to ct4' having logics opposite to those of the control signals ct1 to ct4. The control signals ct1/ct1' to ct4/ct4' will be output to the drive module 300 to correspondingly control fifth transistors 380, 390 in the drive module 300 to be switched on or switched off. In the drive module 300, to obtain greater elasticity, multiple fifth transistors 380, 390 are disposed, but stray capacitance thereof would affect a transmission speed. Therefore, to reduce the impact, control signals ct1/ct1' to ct4/ct4' having greater amplitudes need to be provided to the fifth transistors 380, 390. Therefore, in the present invention, the manipulation signals cs1 to cs4 are converted to control signals ct1/ct1' to ct4/ct4' having greater amplitudes by using the signal conversion unit 410.

In an embodiment, if control signals ct1/ct1' to ct4/ct4' having greater amplitudes are needed, the foregoing signal conversion unit 410 may be provided with more third inverters. For example, a third-stage third inverter is further connected in series following the third inverter 430, and the to-be-reached first logic voltage and second logic voltage are provided to the third-stage inverter. In addition, between every two third inverters connected to each other, a voltage value of a first logic voltage received by a post-stage third inverter is higher than a voltage value of a first logic voltage received by a pre-stage third inverter; and conversely, a voltage value of a second logic voltage received by the post-stage third inverter is lower than a voltage value of a second logic voltage received by the pre-stage third inverter.

Figure 10:
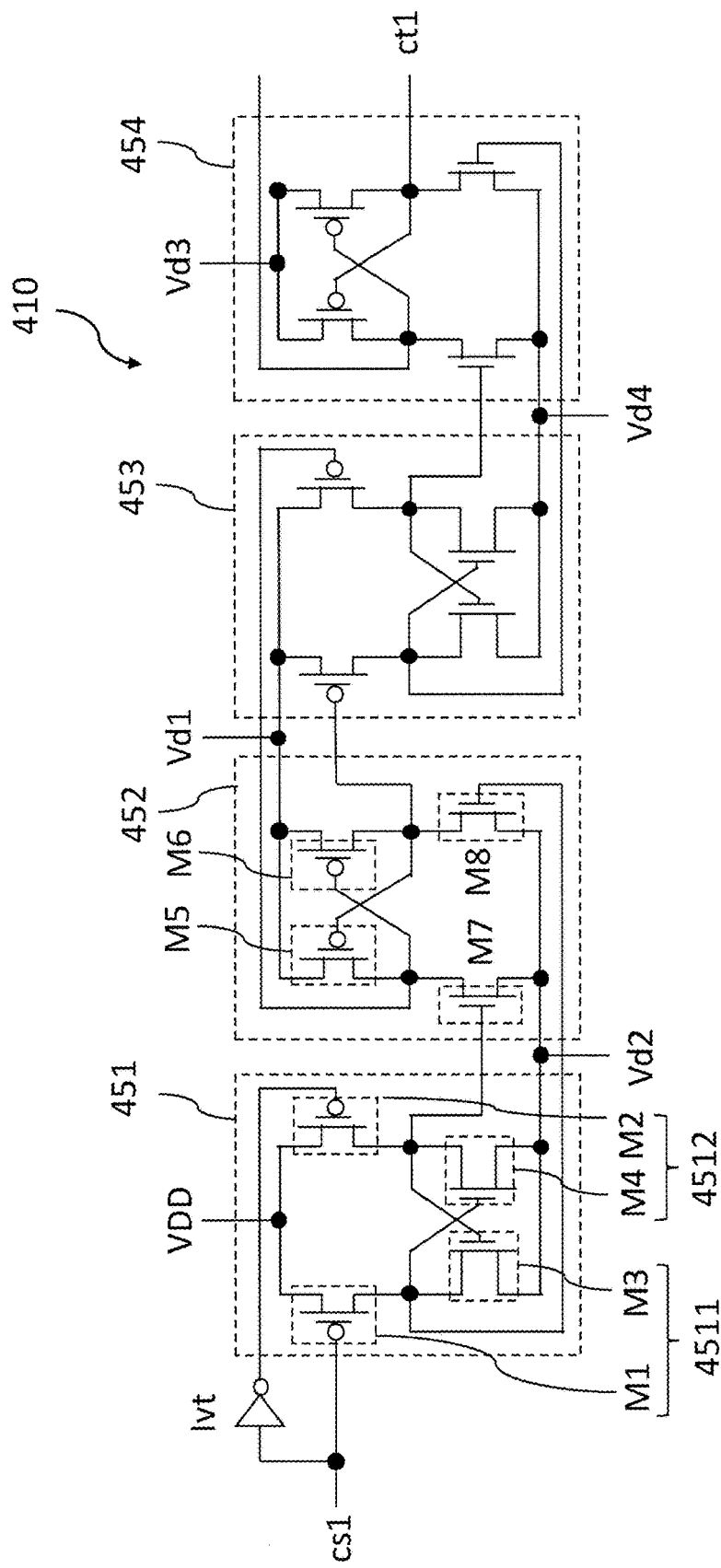
FIG. 10 is a schematic diagram of a signal conversion unit according to another embodiment of the present invention.

Refer to FIG. 10, which is a schematic diagram of a signal conversion unit 410 according to another embodiment of the present invention, a signal conversion unit 410 of the first stage is also used as an example herein. Herein, in the signal conversion unit 410, four level shift circuits 451, 452, 453, 454 are used to replace the foregoing two third inverters 420, 430.

The level shift circuit 451 includes four ninth transistors M1, M2, M3, M4, where the ninth transistors M1, M2 are PMOSs, and the ninth transistors M3, M4 are NMOSs. A drain of the ninth transistor M1 is connected to a drain of the ninth transistor M3; and a drain of the ninth transistor M2 is connected to a drain of the ninth transistor M4. A source of the ninth transistor M1 is connected to a source of the ninth transistor M2 and is connected to the voltage VDD; and a source of the ninth transistor M3 is connected to a source of the ninth transistor M4 and is connected to the voltage Vd2. An inverter Ivt is connected between a gate of the ninth transistor M1 and a gate of the ninth transistor M2, that is, an output end of the inverter Ivt is connected to the gate of the ninth transistor M2, and an input end of the inverter Ivt is connected to the gate of the ninth transistor M1 and receive the manipulation signal cs1. A gate of the ninth transistor M3 is connected to the drain of the ninth transistor M4; and a gate of the ninth transistor M4 is connected to the drain of the ninth transistor M3.

Figure 11:
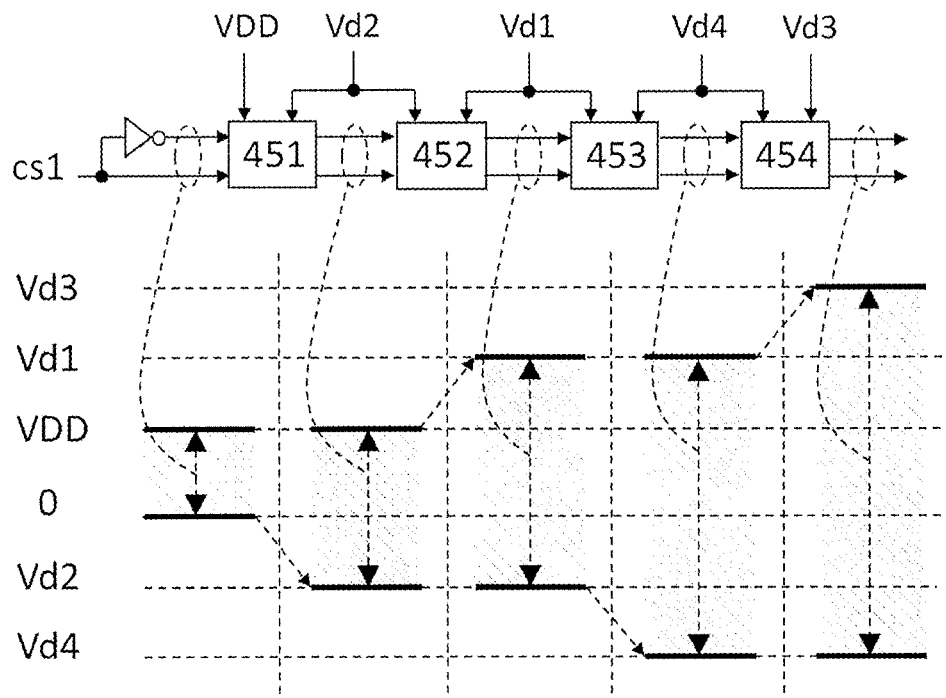
FIG. 11 is a schematic diagram of signal shifting of a manipulation signal according to an embodiment of the present invention.

Refer to FIG. 10 and FIG. 11 together, where FIG. 11 is a schematic diagram of signal shifting of a manipulation signal cs1 according to an embodiment of the present invention. When the manipulation signal cs1 is 0 volt, it is inverted by the inverter Ivt to be the voltage VDD, so as to enable the gate of the ninth transistor M2 to be the voltage VDD and the gate of the ninth transistor M1 to be 0 volt. Therefore, the ninth transistor M1 is switched on, and the ninth transistor M2 is switched off. At this time, the gate of the ninth transistor M4 receives the voltage VDD by using the switched-on ninth transistor M1, so as to switch on the ninth transistor M4 and switch off the ninth transistor M3, and an output end of the level shift circuit 451 (namely, a drain voltage of the ninth transistor M4) is thus output the voltage Vd2. At this time, the output voltage of another output end of the level shift circuit 451 (namely, a drain voltage of the ninth transistor M3) is VDD. That is, a logical level range of the manipulation signal cs1 changes from between the ground voltage (namely, 0 volts) and the voltage VDD to between the voltage Vd2 and the voltage VDD by means of the change of the shift circuit 451. Conversely, when the manipulation signal cs1 is the voltage VDD, the ninth transistors M1, M4 are switched off, and the ninth transistor M2, M3 are switched on. Therefore, the output end of the level shift circuit 451 (namely, the drain voltage of the ninth transistor M4) still maintains the output voltage VDD, and at this time, another output end of the level shift circuit 451 (namely, the drain voltage of the ninth transistor M3) outputs the voltage Vd2.

Subsequently, the level shift circuit 452 receives the output signal of the level shift circuit 451. The level shift circuit 452 also includes four ninth transistors M5, M6, M7, M8. The ninth transistors M5, M6 are PMOSs, and the ninth transistors M7, M8 are NMOSs. A drain of the ninth transistor M5 is connected to a drain of the ninth transistor M7; and a drain of the ninth transistor M6 is connected to a drain of the ninth transistor M8. A source of the ninth transistor M5 is connected to a source of the ninth transistor M6 and is connected to the voltage Vd1; and a source of the ninth transistor M7 is connected to a source of the ninth transistor M8 and is connected to the voltage Vd2. A gate of the ninth transistor M5 is connected to the drain of the ninth transistor M6; and a gate of the ninth transistor M6 is connected to the drain of the ninth transistor M5. A gate of the ninth transistor M7 is connected to an output end of the level shift circuit 451; and a gate of the ninth transistor M8 is connected to another output end of the level shift circuit 451 (namely, the drains of the ninth transistors M1, M3).

Referring to FIG. 10 and FIG. 11 together, when the gate of the ninth transistor M7 receives the voltage Vd2, the ninth transistor M7 is switched off, the gate of the ninth transistor M8 receives the voltage VDD by using the ninth transistor Ml to be switched on. At this time, the gate of the ninth transistor M5 becomes the voltage Vd2 by using the switched-on ninth transistor M8. Therefore, the ninth transistor M5 is switched on, and the ninth transistor M6 is switched off. Therefore, the output end of the level shift circuit 452 (namely, the drain of the ninth transistor M8) still maintains the output voltage Vd2, and at this time, another output end of the level shift circuit 452 (namely, the drain of the ninth transistor M7) outputs the voltage Vdl. Conversely, when the gate of the ninth transistor M7 receives the voltage VDD, the ninth transistor M7 is switched on, the ninth transistor M8 is switched off, the ninth transistor M6 is switched on, and the ninth transistor M5 is switched off. Therefore, the output end of the level shift circuit 452 (namely, the drain of the ninth transistor M8) receives the voltage Vdl by using the switched-on ninth transistor M6, and at this time, another output end of the level shift circuit 452 (namely, the drain of the ninth transistor M7) outputs the voltage Vd2. A range of an output logic level of the shift circuit 451 changes from between the voltage Vd2 and the voltage VDD to between the voltage Vd2 and the voltage Vd1 by means of the change of the shift circuit 452. That is, the voltage VDD is shifted upward to the voltage Vd1.

Operation principles of the level shift circuits 453, 454 are similar to the foregoing ones, and are not further described in detail herein. As shown in FIG. 11, the range of the logical level may be changed from between the voltage Vd2 and the voltage Vd1 to between the voltage Vd4 and the voltage Vdl by using the level shift circuit 453, and the range of the logical level may be changed from between the voltage Vd4 and the voltage Vd1 to between the voltage Vd4 and the voltage Vd3 by using the level shift circuit 454. Hence, finally, the level shift circuit 454 converts the control signal ctl from the original 0 volt or the voltage VDD to the second logic voltage Vd4 (−2Vtn for example, and the level of Vd4 could be even lower than −2Vtn) or the first logic voltage Vd3 ((VDD+2Vtp) for example, and the level of Vd3 could be even higher than (VDD+2Vtp)), that is, the amplitude of the signal is increased.

From the foregoing description, it could be understood that the signal adaptation module 410 includes a plurality of level shift circuits 451, 452, 453, 454 connected in series. Each level shift circuit (the level shift circuit 451 is used as an example) includes a transistor group 4511 constituted by two ninth transistors M1, M3 whose drains are connected to each other and a transistor group 4512 constituted by two ninth transistors M2, M4 whose drains are connected to each other. A gate of one ninth transistor M3 in the transistor group 4511 is connected to a drain of one ninth transistor M4 in the other transistor group 4512 and serve as an output end; and a gate of one ninth transistor M4 in the transistor group 4512 is connected to a drain of one ninth transistor M3 in the transistor group 4511 and serves as an output end. An output end of the transistor group 4511 of the level shift circuit 451 (namely, a drain of the ninth transistor M3) conducts to the second logical voltage Vd2. An output end of one transistor group of the level shift circuit 452 (namely, a drain of the ninth transistor M6) conducts to the second logical voltage Vd1. By that analogy, an output end of one transistor group in each level shift circuit 452 conducts to a first logic voltage or a second logic voltage. As shown in FIG. 11, the first logic voltages Vd1 and Vd3 are different from each other; and the second logic voltages Vd2 and Vd4 are different from each other.

In an embodiment, the circuit size of the second inverter array 370 of each cell is proportionally (binary weighting) increased cell by cell, for example, the circuit size of the second-cell second inverter 370 is two times the circuit size of the first-cell second inverter 370, the circuit size of the third-cell second inverter 370 is four times the circuit size of the first-cell second inverter 370, and the so on. The areas of the signal conversion unit 410 and fourth inverter 440 of each stage are also proportionally increased cell by cell correspondingly.

Figure 12:
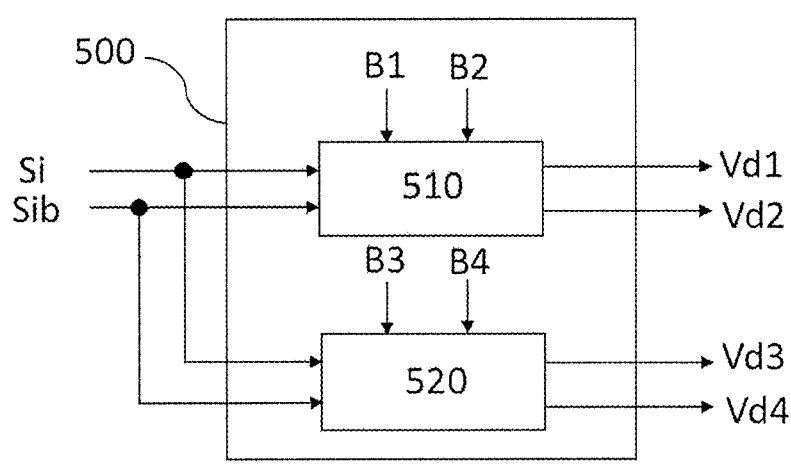
FIG. 12 is a schematic diagram of a voltage generation module according to an embodiment of the present invention.

Refer to FIG. 12, which is a schematic diagram of a voltage generation module 500 according to an embodiment of the present invention. To generate the foregoing two groups, first logic voltages (Vd1 and Vd3) and second logic voltages (Vd2 and Vd4), the voltage generation module 500 includes two voltage generation units 510, 520. The voltage generation unit 510 uses the first input signal Si, the second input signal Sib, the first bias voltage B1 and the second bias voltage B2 to generate a first logic voltage Vd1 and a second logic voltage Vd2; and the voltage generation unit 520 uses the first input signal Si, the second input signal Sib, the third bias voltage B3 and the fourth bias voltage B4 to generate a first logic voltage Vd3 and a second logic voltage Vd4.

Figure 13:
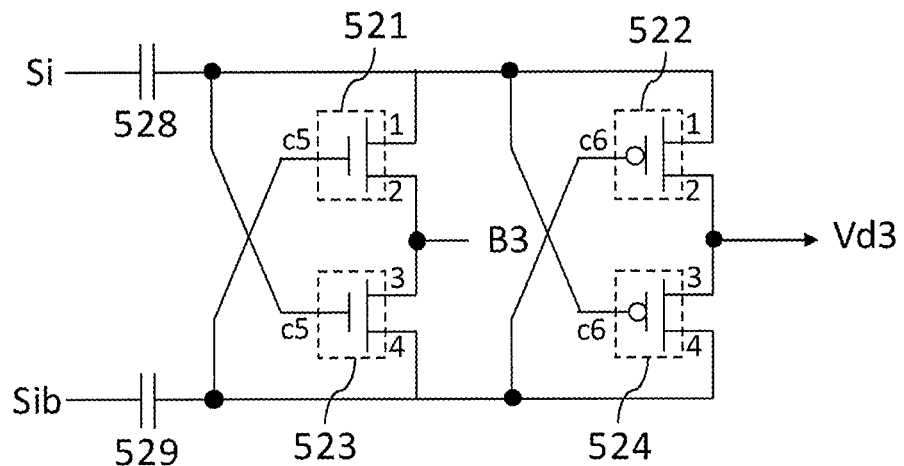
FIG. 13 is a schematic diagram of a first block of a voltage generation unit according to an embodiment of the present invention.
Figure 14:
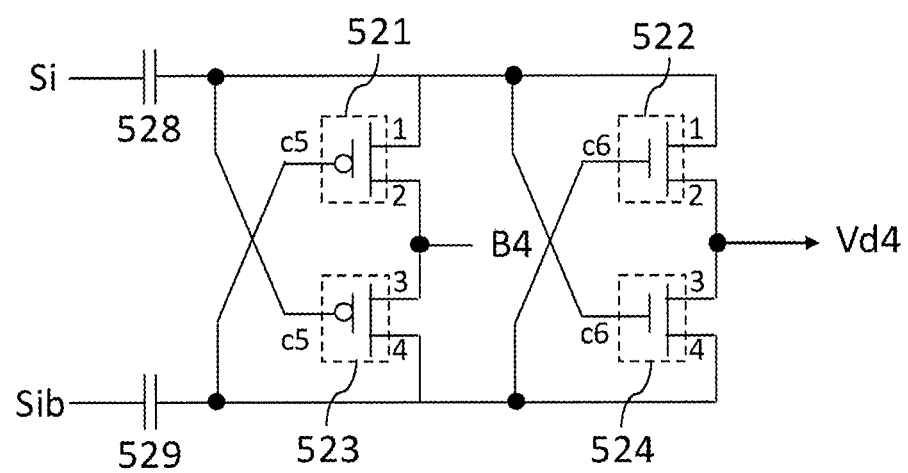
FIG. 14 is a schematic diagram of a second block of a voltage generation unit according to an embodiment of the present invention.

FIG. 13 is a schematic diagram of a first block of a voltage generation unit 520 according to an embodiment of the present invention, and FIG. 14 is a schematic diagram of a second block of a voltage generation unit 520 according to an embodiment of the present invention. That is, circuits shown in FIG. 13 and FIG. 14 may constitute the voltage generation unit 520 as shown in FIG. 12. Referring to FIG. 13, the first block includes a third capacitor 528, a fourth capacitor 529, two seventh transistors 521, 523 connected in series and two eighth transistors 522, 524 connected in series. The third capacitor 528 receives the first input signal Si, and the fourth capacitor 529 receives the second input signal Sib. The seventh transistors 521, 523 are NMOSs, and the eighth transistors 522, 524 are PMOSs. A fifth control end c5 of the seventh transistor 521 and a fourth end 4 of the seventh transistor 523 are connected to a fourth capacitor 529; and a fifth control end c5 of the seventh transistor 523 and a first end 1 of the seventh transistor 521 are connected to a third capacitor 528. A second end 2 of the seventh transistor 521 and a third end 3 of the seventh transistor 523 are connected together to receive a third bias voltage B3. A sixth control end c6 of the eighth transistor 522 and a fourth end 4 of the eighth transistor 524 are connected to the fourth capacitor 529; and a sixth control end c6 of the eighth transistor 524 and a first end 1 of the eighth transistor 522 are connected to the third capacitor 528. A second end 2 of the eighth transistor 522 and a third end 3 of the eighth transistor 524 are connected together to output a first logic voltage Vd3. When the first input signal Si changes from the supply voltage VDD to 0 volt, and the second input signal Sib changes from 0 volt to the supply voltage VDD, the seventh transistor 521 and the eighth transistor 524 are switched on, and the seventh transistor 523 and the eighth transistor 522 are switched off. At this time, the first end 1 of the seventh transistor 521 is connected to the third bias voltage B3 because the seventh transistor 521 is switched on, and if the third bias voltage B3 is equal to the supply voltage VDD, the first end 1 of the seventh transistor 521 is shifted to the supply voltage VDD. However, because the eighth transistor 522 is switched off, the voltage of the first end 1 of the seventh transistor 521 cannot be output. According to another aspect, because the first input signal Si and the second input signal Sib are differential signals, the fourth end 4 of the seventh transistor 523 shifts upward the second input signal Sib by a voltage of the same magnitude by means of an alternating-current coupling effect of the fourth capacitor 529, that is, shifting up one times the supply voltage VDD to two times the supply voltage VDD. Because the eighth transistor 524 is switched on, which causes that the third end 3 of the eighth transistor 524 is connected to the fourth end 4 of the seventh transistor 523, the first logic voltage Vd3 is two times the supply voltage VDD.

Conversely, that is, when the first input signal Si changes from 0 volt to the supply voltage VDD, and the second input signal Sib changes from the supply voltage VDD to 0 volt, the seventh transistor 523 and the eighth transistor 522 are switched on, and the seventh transistor 521 and the eighth transistor 524 are switched off. At this time, the fourth end 4 of the seventh transistor 523 is connected to the third bias voltage B3 because the seventh transistor 523 is switched on, and if the third bias voltage B3 is equal to the supply voltage VDD, the fourth end 4 of the seventh transistor 523 is connected to the supply voltage VDD. However, because the eighth transistor 524 is switched off, the fourth end 4 of the seventh transistor 523 cannot perform output. According to another aspect, because the first input signal Si and the second input signal Sib are differential signals, the first end 1 of the seventh transistor 521 shifts upward the first input signal Si by a voltage of the same magnitude by means of an alternating-current coupling effect of the third capacitor 528, that is, shifting up one times the supply voltage VDD to two times the supply voltage VDD. Because the eighth transistor 522 is switched on, which causes that the second end 2 of the eighth transistor 522 is connected to the first end 1 of the seventh transistor 521, so as to output two times the supply voltage VDD, in any case, the first logic voltage Vd3 is maintained at two times the supply voltage VDD for the signal adaptation module to use.

As shown in FIG. 14, the second block also includes a third capacitor 528, a fourth capacitor 529, two seventh transistors 521, 523 connected in series and two eighth transistors 522, 524 connected in series. FIG. 14 differs from FIG. 13 in that the seventh transistors 521, 523 of the second block are PMOSs, the eighth transistors 522, 524 of the second block are NMOSs, and a fourth bias voltage B4 (which is 0 volt herein) is received between the seventh transistors 521, 523. When the first input signal Si changes from the supply voltage VDD to 0 volt, and the second input signal Sib changes from 0 volt to the supply voltage VDD, the seventh transistor 523 and eighth transistor 522 are switched on, and the seventh transistor 521 and eighth transistor 524 are switched off, so that the fourth end 4 of the seventh transistor 523 is connected to the fourth bias voltage B4 to be changed to 0 volt, and meanwhile, the first end 1 of seventh transistor 521 has a voltage change the same as that of the first input signal Si, which is shifting 0 volt downward by one times supply voltage VDD to change it to −1 times the supply voltage VDD (namely, −VDD). As stated above, in another case, (that is, when the first input signal Si changes from 0 volt to the supply voltage VDD, and the second input signal Sib changes from the supply voltage VDD to 0 volt), the same result would also be caused, that is, the second logic voltage Vd4 is maintained at the voltage −VDD for the signal adaptation module 400 to use.

Similar to the voltage generation unit 520, the voltage generation unit 510 also includes a first block and a second block as shown in FIG. 13 and FIG. 14. The difference is that the node received the third bias voltage B3 in the first block receives the first bias voltage here, where the first bias voltage B1 is equal to Vtn (the threshold voltage of the seventh transistors 521, 523), and the node received the fourth bias voltage B4 in the second block receives the second voltage here, where the second bias voltage B2 is equal to (VDD−Vtp) (VDD is the supply voltage and Vtp is the threshold voltage of the eighth transistors 522, 524), so that the first logic voltage Vd1 (corresponding to the location of the first logic voltage Vd3 in FIG. 13) output by the first block is (Vtn+VDD), and the second logic voltage Vd2 (corresponding to the location of the second logic voltage Vd4 in FIG. 14) output by the second block is −Vtp. Herein, Vtn and (VDD−Vtp) may be generated by performing resistance voltage division on the voltage VDD and 0 volt.

Although in the foregoing embodiments, the voltage generation module 500 is described by means of receiving of the first input signal Si and the second input signal Sib and has specific voltage values (the supply voltage VDD and 0 volt), the input signals are not limited thereto, and a differential signal ranging from 0 volt to the supply voltage VDD is also acceptable.

In an embodiment, the third bias voltage B3 may be connected to the first logic voltage Vd1, and the fourth bias voltage B4 may be connected to the second logic voltage Vd2.

In some embodiment, the voltage generation module 500 may also include another voltage generation unit to generate another logic voltage. In addition, the first logic voltage Vd3 and the second logic voltage Vd4 may be respectively used as bias voltages of the first block and second block of the voltage generation module 500. By that analogy, the voltage generation module 500 may include more voltage generation units to generate more logic voltages, and the logic voltage output by the pre-stage voltage generation unit may serve as the bias voltage input of the post-stage voltage generation unit.

Figure 15:
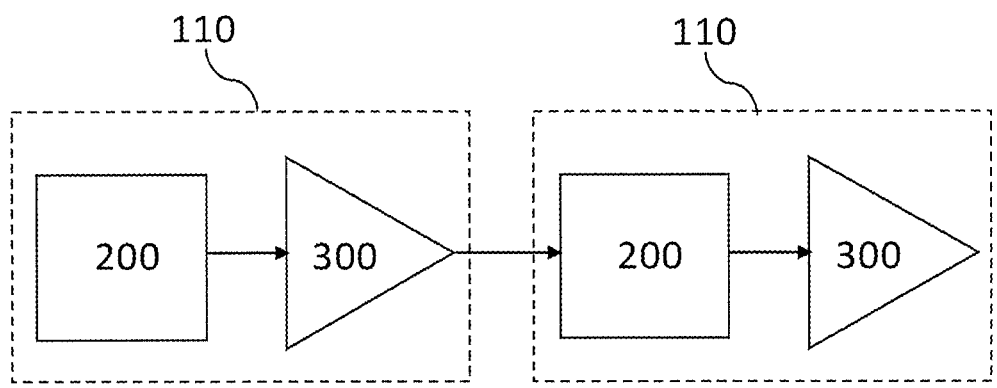
FIG. 15 is a schematic block diagram of a circuit of a stage-by-stage amplification module according to another embodiment of the present invention.

According to that some modules may be implemented by using other circuits in the foregoing embodiments, the present invention does not limit that each module needs to be implemented by using a circuit disclosed in the present invention. For example, in an embodiment, an amplifier of each stage of the stage-by-stage amplification module 100 may be constituted by the foregoing level adjustment module 200 and drive module 300, as shown in FIG. 15.

Figure 16:
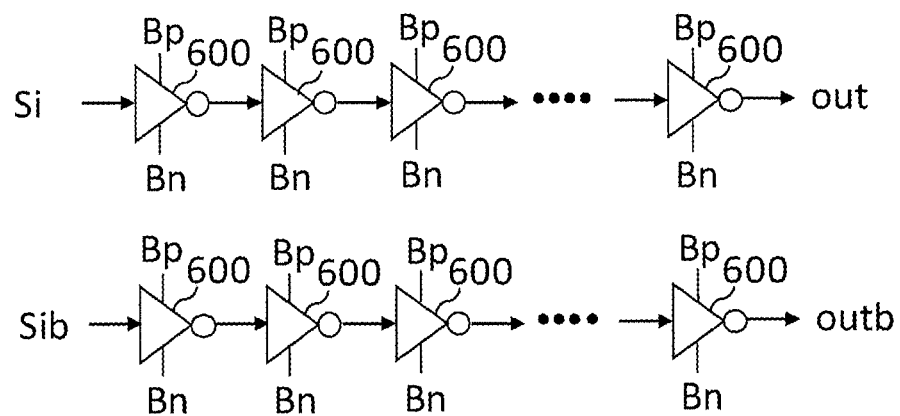
FIG. 16 is a schematic block diagram of a low-voltage differential signaling receiver according to an embodiment of the present invention.

Refer to FIG. 16, which is a schematic block diagram of a low-voltage differential signaling receiver according to an embodiment of the present invention. The low-voltage differential signaling receiver may be configured to receive a different signal (referred to as a differential input signal herein) transmitted by the foregoing low-voltage differential signaling transmitter. The differential input signal is constituted by the first input signal Si and the second input signal Sib. The low-voltage differential signaling receiver includes at least two shift units 600, where two groups of multiple shift units 600 connected in series are used as an example.

Figure 17:
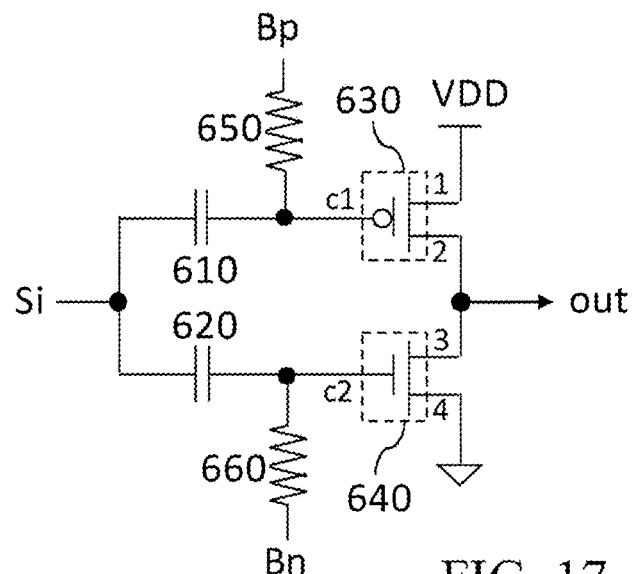
FIG. 17 is a schematic diagram of a shift unit according to an embodiment of the present invention.

Refer to FIG. 17, which is a schematic diagram of a shift unit 600 according to an embodiment of the present invention. The shift unit 600 includes a first capacitor 610, a second capacitor 620, a first transistor 630, and a second transistor 640. The first transistor 630 is a PMOS and includes a first end 1, a second end 2, and a first control end c1. The first control end c1 is connected to the first capacitor 610 and is connected to a pull-up resistor 650 to receive a first bias voltage Bp. The second transistor 640 is a NMOS and includes a third end 3, a fourth end 4, and a second control end c2. The second control end c2 is connected to the second capacitor 620 and is connected to a pull-down resistor 660 to receive a second bias voltage Bn. The first end 1 of the first transistor 630 receives a supply voltage VDD, the fourth end 4 of the second transistor 620 is grounded, and the second end 2 of the first transistor 630 is connected to the third end 3 of the second transistor 640, so as to form a node therebetween as an output end. The first transistor 630 is connected in series to the second transistor 640 to form an inverter, Herein, the first control end c1 of the first transistor 630 and the second control end c2 of the second transistor 640 receive the first input signal Si respectively by using the first capacitor 610 and the second capacitor 620 and output a first output signal out on the node. Herein, a purpose of enabling the first control end c1 of the first transistor 630 to receive the first bias voltage Bp and enabling the second control end c2 of the second transistor 640 to receive the second bias voltage Bn is enabling the inverter constituted by the first transistor 630 and second transistor 640 to maintain a transition region and to have a signal amplifying function. By means of this, the first input signal Si may be amplified to the first output signal out.

Similarly, in another shift unit 600 that receives the second input signal Sib, the first control end c1 of the first resistor 630 and the second control end c2 of the second resistor 640 receive the second input signal Sib respectively by using the first capacitor 610 and the second capacitor 620 and output a second output signal outb on the node.

As shown in FIG. 16, by means of connecting multiple stages of shift units 600 in series, a differential input signal may be gradually amplified. The areas of the shift units 600 are gradually reduced, that is, the area of the post-stage shift unit 600 is smaller than the area of the pre-stage shift unit 600, and a proportional reduction relationship may be established.

Figure 18:
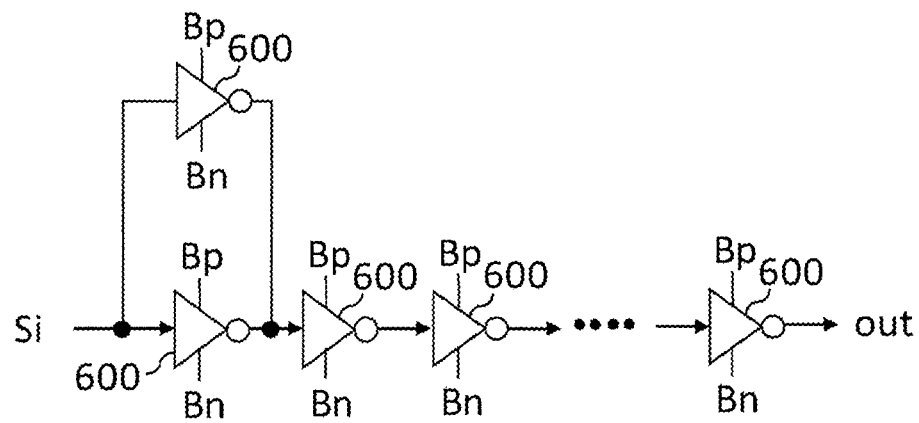
FIG. 18 is a schematic block diagram of a low-voltage differential signaling receiver according to another embodiment of the present invention.
Figure 18:
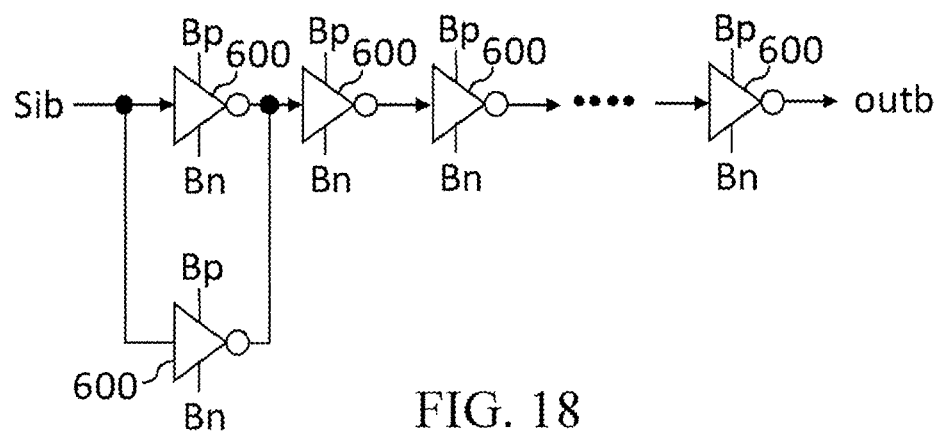

Refer to FIG. 18, which is a schematic block diagram of a low-voltage differential signaling receiver according to another embodiment of the present invention. As compared with FIG. 16, the first-stage shift unit 600 may also be connected in parallel to another shift unit 600, so as to make an amplification effect of the signal preferable.

In an embodiment, the foregoing voltage generation module 500 may be used to generate the foregoing first bias voltage Bp and second bias voltage Bn.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A low-voltage differential signaling transmitter, comprising:
   a amplification module, comprising a plurality of amplifiers connected in sequence to receive and amplify a pair of differential input signals, so as to output a first input signal and a second input signal;
   a level adjustment module, comprising two shift units, wherein after being connected to the amplification module, each of the shift units comprises:
   a first capacitor;
   a second capacitor;
   a first transistor, comprising a first end, a second end, and a first control end, wherein the first end is connected to the first capacitor, so as to receive the first input signal by using the first capacitor; and
   a second transistor, comprising a third end, a fourth end, and a second control end, wherein the fourth end is connected to the second capacitor, so as to receive the second input signal by using the second capacitor, wherein:
   the first control end of the first transistor is connected to the fourth end of the second transistor, the second control end of the second transistor is connected to the first end of the first transistor, the second end of the first transistor is connected to the third end of the second transistor, so as to form a node therebetween, the node of one of the two shift units receives a first bias voltage to shift the first and second input signals downward, so as to output the first and second input signals respectively by using the first end and the fourth end, the node of the other of the two shift units receives a second bias voltage to shift the first and second input signals upward, so as to output first and second input signals respectively by using the first end and the fourth end; and
   a drive module, comprising two first inverters, each of the first inverters comprises two third transistors that are a p-type transistor and a n-type transistor connected in series, the nodes between the two third transistors of the p-type transistor and the n-type transistor are individually connected to a signal output end, so as to output a pair of differential output signals,
   wherein one of the p-type transistors is controlled by the first input signal that is shifted downward, the other of the p-type transistors is controlled by the second input signal that is shifted downward,
   wherein one of the n-type transistors is controlled by the first input signal that is shifted upward, the other of the n-type transistors is controlled by the second input signal that is shifted upward.

2. The low-voltage differential signaling transmitter according to claim 1, wherein the drive module further comprises two groups of a plurality of second inverters connected in series, each of the second inverters comprises two fourth transistors and two fifth transistors that are connected in series, control ends of the two fourth transistors are respectively connected to the first ends of the two shift units or are respectively connected to the fourth ends of the two shift units, the two fifth transistors are connected between the two fourth transistors, and one of the signal output end is connected between the two fifth transistors.

3. The low-voltage differential signaling transmitter according to claim 2, further comprising a signal adaptation module, which receives a plurality of manipulation signals and converts the manipulation signals into a plurality of control signals having a greater amplitude, wherein the signal adaptation module is connected to control ends of the two fifth transistors of the second inverters, so as to respectively control, according to the control signals, the two fifth transistors of the second inverter to switch on or switch off.

4. The low-voltage differential signaling transmitter according to claim 3, wherein the signal adaptation module comprises a plurality of third inverters connected in series, and each of the third inverters separately power supplied by a first logic voltage and a second logic voltage that are different.

5. The low-voltage differential signaling transmitter according to claim 4, further comprising a voltage generation module, configured to generate each of the first logic voltages and each of the second logic voltages for the signal adaptation module to operate.

6. The low-voltage differential signaling transmitter according to claim 5, wherein the voltage generation module comprises two voltage generation units, so as to respectively generate the first logic voltages and the second logic voltages that are different, wherein each of the voltage generation units comprises a third capacitor, a fourth capacitor, two seventh transistors and two eighth transistors, the third capacitor receives the first input signal, the fourth capacitor receives the second input signal, the two seventh transistors are connected in series to each other, the two eighth transistors are connected in series to each other, and an end that connects the two seventh transistors in series and an end that connects the two eighth transistors in series are connected to the third capacitor, another end that connects the two seventh transistors in series and another end that connects the two eighth transistors in series are connected to the fourth capacitor, a bias voltage is received between the two seventh transistors, and the first logic voltage or the second logic voltage is output between the two eighth transistors.

7. The low-voltage differential signaling transmitter according to claim 3, wherein the signal adaptation module comprises a plurality of level shift circuits connected in series, each of the level shift circuits comprises two transistor groups constituted by two ninth transistors whose drains are connected to each other, a gate of one of the ninth transistors in each of the transistors is connected to a drain of one of the ninth transistors in each of the other transistor group and serves as an output end, and the output end of one of the two transistor groups of each of the level shift circuit individually conducts to a different first logic voltage or a different second logic voltage.

8. The low-voltage differential signaling transmitter according to claim 1, wherein each of the amplifiers of the amplification module comprises the level adjustment module and the drive module that are connected to each other.

* * * * *